| (12) | United States Patent | (10) Patent No.: | US 7,978,109 B1 |
|---|---|---|---|
| | Kuramochi | (45) Date of Patent: | Jul. 12, 2011 |

(54) OUTPUT APPARATUS AND TEST APPARATUS

(75) Inventor: Yasuhide Kuramochi, Gunma (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 12/708,508

(22) Filed: Feb. 18, 2010

(51) Int. Cl.
*H03M 1/66* (2006.01)

(52) U.S. Cl. ........ 341/144; 341/118; 341/120; 341/152; 341/153

(58) Field of Classification Search .................. 341/118, 341/128.143, 144, 152, 153
See application file for complete search history.

(56) References Cited

U.S. PATENT DOCUMENTS

| 5,689,258 | A  | * | 11/1997 | Nakamura et al. ............ 341/136 |
|---|---|---|---|---|
| 6,664,906 | B2 |   | 12/2003 | Volk |
| 7,132,970 | B2 | * | 11/2006 | Pan ............... 341/154 |
| 7,256,720 | B2 | * | 8/2007  | Fukuda ........... 341/143 |
| 7,528,754 | B1 | * | 5/2009  | Bakkaloglu et al. .......... 341/143 |
| 7,545,304 | B1 | * | 6/2009  | Wu et al. ........... 341/144 |
| 7,746,259 | B2 | * | 6/2010  | Dedic et al. ........ 341/144 |
| 7,812,751 | B2 | * | 10/2010 | Eloranta et al. ............ 341/144 |
| 2006/0066462 | A1 | * | 3/2006 | Paillet et al. ........... 341/143 |
| 2007/0096969 | A1 | * | 5/2007 | Briaire .................. 341/155 |
| 2007/0194963 | A1 |   | 8/2007 | Sasaki |
| 2009/0237283 | A1 | * | 9/2009 | Tu et al. ................. 341/143 |

FOREIGN PATENT DOCUMENTS

| JP | H06-132821 A | 5/1994 |
|---|---|---|
| JP | 2974377 B2 | 11/1999 |
| JP | 2003-115761 A | 4/2003 |
| JP | 2007-227990 A | 9/2007 |

* cited by examiner

*Primary Examiner* — Linh V Nguyen
(74) *Attorney, Agent, or Firm* — Chen Yoshimura LLP

(57) ABSTRACT

Provided is an output apparatus for outputting a current from an output end, including: a plurality of current sources; a plurality of switches provided in association with the plurality of current sources respectively, and switching whether to supply a current of a corresponding current source to the output end; a time changing section that changes a propagation time of each of a plurality of control signals for controlling switching states of the plurality of switches respectively; and an adjusting section that adjusts the propagation time of each of the plurality of control signals to reduce glitch noise contained in a current supplied to the output end.

14 Claims, 12 Drawing Sheets

OUTPUT APPARATUS AND TEST APPARATUS

BACKGROUND

1. Technical Field

The present invention relates to an output apparatus and a test apparatus.

2. Related Art

A current output type DA conversion apparatus is known. A current output type DA conversion apparatus includes a plurality of current sources, and a plurality of switches for switching connection between each of the plurality of current sources and the output end. The current output type DA conversion apparatus switches current of the plurality of current sources corresponding to the input data, to supply the current corresponding to the input data to the output end.

The following are prior art documents.
Patent Document No. 1: U.S. Pat. No. 6,664,906
Patent Document No. 2: Japanese Patent Application Publication No. 2003-115761
Patent Document No. 3: Japanese Patent Application Publication No. 2007-227990
Patent Document No. 4: Japanese Patent Application Publication No. H06-132821
Patent Document No. 5: Japanese Patent No. 2974377

However, a current output type DA conversion apparatus causes glitch noise in the output current, if switching timing is different among the plurality of switches. For example, suppose that a DA conversion apparatus having four switches is provided with input data for switching the four switches from the state of "1000" to the state of "0111." In this case, the switching timing of the most significant bit is slower than the other bits, the state transition of the four switches will be "1000"→"1111"→"0111." Therefore, the DA conversion apparatus will cause large glitch noise in the intermediate state where the four switches are brought into the state of "1111."

Patent Document No. 1 and Patent Document No. 2 disclose a circuit in which on/off skew of a differential switch is reduced using SR latch. The circuit disclosed in Patent Document No. 1 and Patent Document No. 2, however, cannot reduce the skew between pieces of data.

Patent Document No. 3 discloses a circuit that changes timings of logic for driving a switch, to reduce the glitch noise. However, with the circuit disclosed in Patent Document No. 3, the timing can only be adjusted within the range of the delay control of inverters.

Patent Document No. 4 discloses a circuit for canceling out glitch noise caused in a DAC using a signal generated by another DAC. The circuit disclosed in Patent Document No. 4, however, has to be equipped with an additional high-speed DAC, and further to perform operation, which inhibits high-speed operation.

Patent Document No. 5 discloses a circuit that simulates the glitch noise occurring in a DAC using a pulse current, to cancel it out in the later stages. However, the circuit disclosed in Patent Document No. 5 has to additionally include a high-speed pulse generator, and further to operate the adder in high speed.

As explained above, the circuits disclosed in Patent Documents No. 1-No. 5 cannot assuredly reduce glitch noise of a current output type DA conversion apparatus, unless using an additional high-speed circuit.

SUMMARY

Therefore, it is an object of an aspect of the innovations herein to provide an output apparatus and a test apparatus, which are capable of overcoming the above drawbacks accompanying the related art. The above and other objects can be achieved by combinations described in the independent claims. The dependent claims define further advantageous and exemplary combinations of the innovations herein.

According to an aspect related to the innovations herein, one exemplary output apparatus for outputting a current from an output end, includes: a plurality of current sources; a plurality of switches provided in association with the plurality of current sources respectively, and switching whether to supply a current of a corresponding current source to the output end; a time changing section that changes a propagation time of each of a plurality of control signals for controlling switching states of the plurality of switches respectively; and an adjusting section that adjusts the propagation time of each of the plurality of control signals to reduce glitch noise contained in a current supplied to the output end.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
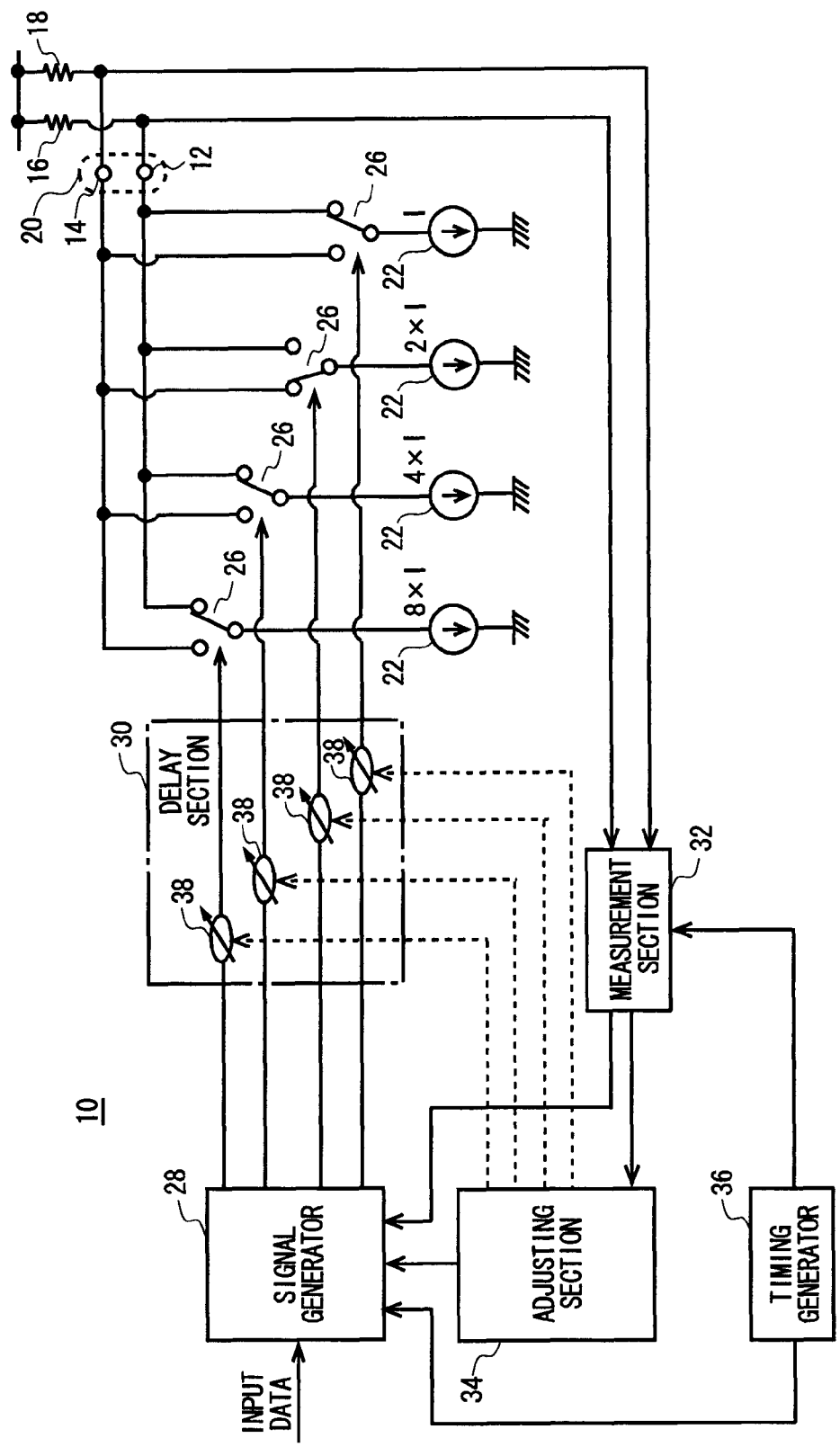
FIG. 1 shows a configuration of a DA conversion apparatus 10 according to the present embodiment.

FIG. 1 shows a configuration of a DA conversion apparatus 10 according to the present embodiment. The DA conversion apparatus 10 supplies a current corresponding to the input data received from outside, to the output end(s) 20. In the present example, the DA conversion apparatus 10 supplies a current corresponding to the input data received from outside, to the first output end 12, which is one of the output ends 20. The DA conversion apparatus 10 also supplies, to the other output end (second output end 14) of the output ends 20, current invert to the current supplied to the first output end 12, with the common current as the center.

In the present example, the first output end 12 is connected to a first reference potential (e.g., power source potential) via a first resistance 16. The second output end 14 is connected to the first reference potential (e.g., power source potential) via a second resistance 18. The DA conversion apparatus 10 can output the output voltage corresponding to the input data respectively from the first output end 12 and the second output end 14, by supplying the current corresponding to the input data to the first output end 12 and the second output end 14. Note that the first resistance 16 and the second resistance 18 may be either inside the DA conversion apparatus 10, or be outside and connected to the DA conversion apparatus 10.

The DA conversion apparatus 10 includes a plurality of current sources 22, a plurality of switches 26, a signal generator 28, a delay section 30, a measurement section 32, an adjusting section 34, and a timing generator 36.

Each of the plurality of current sources 22 is a constant current source supplying a predetermined amount of current. Each of the plurality of current sources 22 has an end connected to a second reference potential (e.g., ground potential), and the other end connected to either the first output end 12 or the second output end 14 via a corresponding switch 26.

For example, each of the plurality of current sources 22 is provided in association with one of bits of input data, and supplies a current corresponding to a weight of a corresponding bit. The described plurality of current sources 22 supply current such that the amount of current increases by a power of 2 starting from the current source 22 corresponding to the least significant bit. For example, the current source 22 corresponding to the least significant bit supplies a current in the amount of $2^0 \times I$, the current source 22 corresponding to the second bit supplies a current in the amount of $2^1 \times I$, and the current source 22 corresponding to the Nth bit (where N is an integer equal to or greater than 2) supplies a current in the amount of $2^{(N-1)} \times I$.

Note that each of the plurality of current sources 22 may also be a variable current source having a current setting end and supplying a current corresponding to the designated voltage applied to this current setting end. Each of the plurality of current sources 22 may be set from outside, to be a designated voltage different by the power of 2.

Each of the plurality of switches 26 is provided to correspond to one of the plurality of current sources 22. Each of the plurality of switches 26 receives, from the signal generator 28 via the delay section 30, a control signal for controlling the switch state of the corresponding switch 26. Each of the plurality of switches 26 switches whether to supply the current of the corresponding current source 22 to the output end(s) 20, according to the received control signal.

In the present example, each of the plurality of switches 26 switches whether to supply the current of the corresponding current source 22 to the first output end 12 or to the second output end 14. For example, when the value of the received control signal is 1, each of the plurality of switches 26 supplies the current of the corresponding current source 22 to the first output end 12, whereas when the value of the control signal is 0, each of the plurality of switches 26 supplies the current of the corresponding current source 22 to the second output end 14.

The signal generator 28 receives input data from outside. The signal generator 28 generates a plurality of control signals corresponding to the input data received from outside. For example, the signal generator 28 generates a plurality of control signals corresponding to a plurality of bits making up the input data. The signal generator 28 supplies the plurality of generated control signals to the plurality of switches 26 via the delay section 30.

The delay section 30 delays each of the plurality of control signals provided from the signal generator 28 to the plurality of switches 26, by a delay amount having been set. For example, the delay section 30 includes a plurality of variable delay circuits 38 respectively corresponding to the plurality of control signals. Each of the plurality of variable delay circuits 38 is provided with a set value from the adjusting section 34, to delay the corresponding control signal by a delay amount corresponding to the provided set value having.

Note that the delay section 30 may have any configuration as long as it is a time changing section that changes a propagation time of a path from the signal generator 28 to a corresponding switch 26 (i.e. a propagation time of a control signal). For example, the delay section 30 is a delay element changing a propagation time of a control signal, by making the waveform of the control signal sluggish using a capacitor or the like. The delay section 30 may also be a delay circuit for changing a propagation time of a control signal, by controlling a plurality of delay elements or flip-flops connected in series to propagate the control signal, and controlling a selected one of the plurality of delay elements or flip-flops to output the control signal.

The measurement section 32 measures a voltage waveform corresponding to the current supplied to the output end(s) 20 when switching the current supplied to the output end(s) 20. In this example, the measurement section 32 measures the waveform of a differential voltage between the first output end 12 and the second output end 14.

The adjusting section 34 controls the delay section 30 to reduce the glitch noise contained in the current supplied to the output end(s) 20, to adjust the propagation time of each of the plurality of control signals. For example, the adjusting section 34 adjusts the delay amount of each of the plurality of control signals to reduce the glitch noise contained in the voltage waveform, based on the measurement result of the measurement section 32. In this example, the adjusting section 34 changes the set value to be supplied to each of the plurality of variable delay circuits 38 of the delay section 30, thereby adjusting the delay amount of the plurality of control signals. In an example where a delay element or a flip-flop connected in series is used to propagate a control signal to perform delay, the adjusting section 34 may adjust the position of a delay element or a flip-flop from which the control signal is outputted.

The timing generator 36 generates a timing signal representing a reference timing of the DA conversion apparatus 10. For example, the timing generator 36 generates a timing signal in a predetermined period. The signal generator 28 outputs a plurality of control signals using the timing signal generated by the timing generator 36 as a reference. In addition, the signal generator 28 measures the voltage waveform corresponding to the current supplied to the output end(s) 20, by sampling the voltage at the output end(s) 20 using the timing signal generated by the timing generator 36 as a reference.

The DA conversion apparatus 10 having the stated configuration can output the current corresponding to the input data supplied from outside, from the output end(s) 20. Furthermore, the DA conversion apparatus 10 having the stated configuration can output a current having small glitch noise by adequately adjusting the delay amount of each of the plurality of control signals, even without any additional circuit for high-speed operation.

Figure 2:
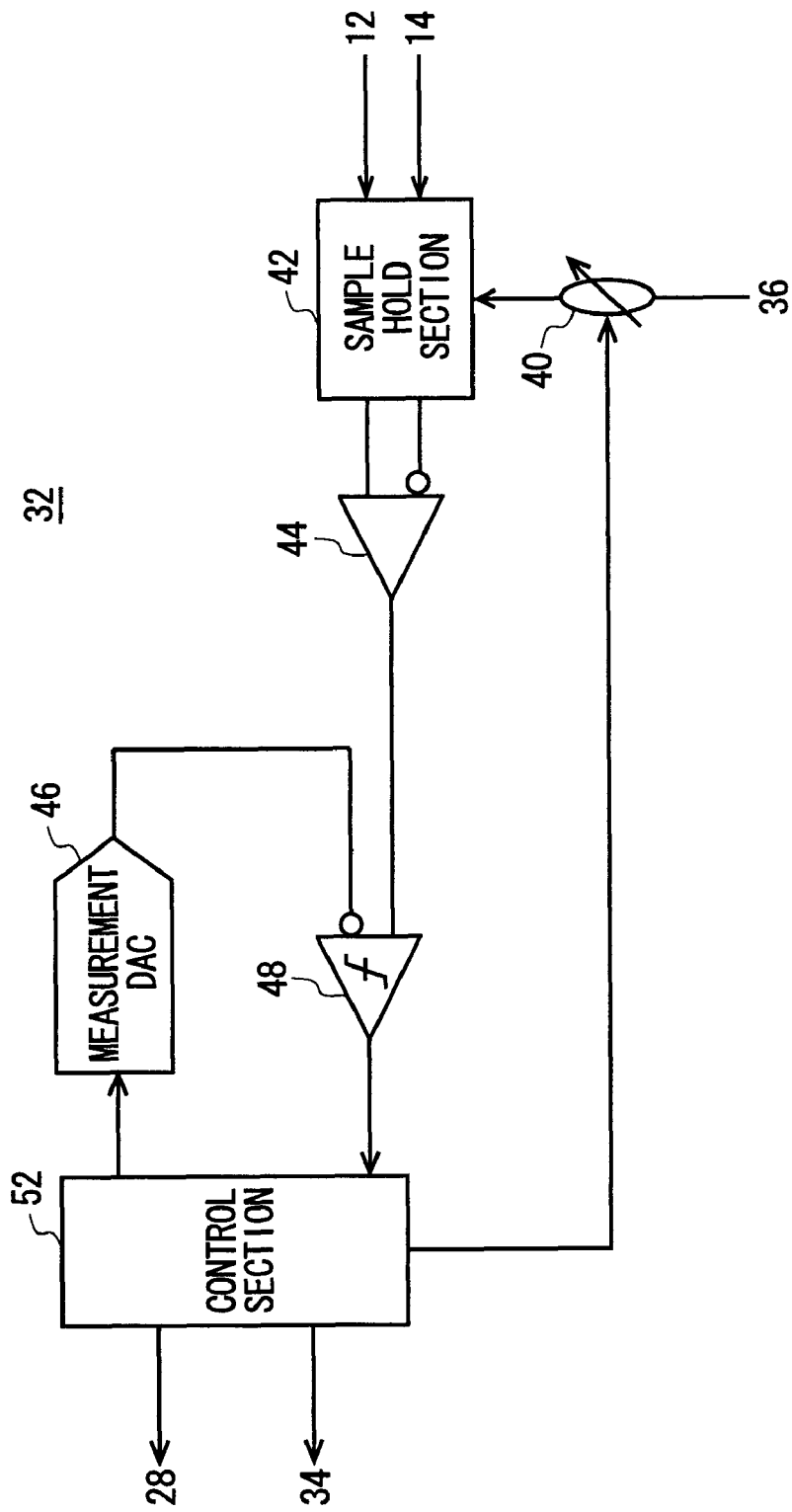
FIG. 2 shows an exemplary configuration of a measurement section 32 according to the present embodiment.

FIG. 2 shows an exemplary configuration of the measurement apparatus 32 according to the present embodiment. The measurement section 32 includes a timing adjusting section 40, a sample hold section 42, a differential/single conversion section 44, a measurement DAC 46, a comparator 48, and a control section 52.

The timing adjusting section 40 delays the timing signal supplied by the timing generator 36, by an amount of time designated by the control section 52. The sample hold section 42 samples the voltage at the output end(s) 20 of the DA conversion apparatus 10, at the comparison timing designated by the timing signal delayed by the timing adjusting section 40, and holds the sampled voltage. In this example, the sample hold section 42 samples the differential voltage between the first output end 12 and the second output end 14, and holds the sampled differential voltage.

The differential/single conversion section 44 converts the differential voltage held by the sample hold section 42 into a single ended voltage. In case where the sample hold section 42 samples a single ended voltage, the measurement section 32 does not include a differential/single conversion section 44.

The measurement DAC 46 generates a comparison voltage corresponding to the comparison data supplied from the control section 52. An example of the measurement DAC 46 is of a charge redistribution type.

The comparator 48 compares the magnitude of the comparison voltage generated by the measurement DAC 46 and the magnitude of the voltage generated at the output end(s) 20 at the comparison timing. In this particular example, the comparator 48 compares the comparison voltage and the voltage held by the sample hold section 42.

The control section 52 controls the signal generator 28, to generate, from the signal generator 28, a plurality of control signals for supplying a current of a designated waveform to the output end(s) 20 of the DA conversion apparatus 10. For example, the control section 52 generates a plurality of control signals for switching the current supplied to the output end(s) 20, from the first amount of current to the second amount of current.

Meanwhile, the control section 52 controls the comparison data to be supplied to the measurement DAC 46 and the delay time to be supplied to the timing adjusting section 40, to control the comparison voltage and the comparison timing. The control section 52 measures the voltage waveform at the output end(s) 20 generated when the current of the designated waveform is supplied, based on the comparison result obtained by the comparator 48 as a result of controlling the comparison voltage and the comparison timing.

The measurement section 32 having the stated configuration can measure the voltage waveform at the output end(s) 20 when the current of the designated waveform is supplied. For example, the measurement section 32 measures a voltage waveform corresponding to the current supplied to the output end(s) 20 when switching the current supplied to the output end(s) 20. The measurement operation by the measurement section 32 is detailed later.

Figure 3:
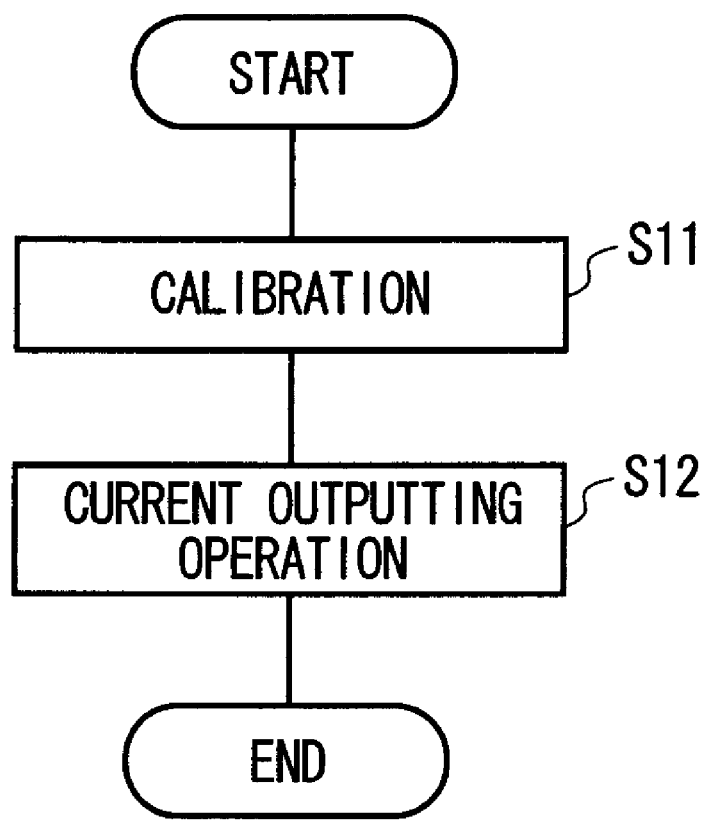
FIG. 3 shows a processing flow of a DA conversion apparatus 10 according to the present embodiment.

FIG. 3 shows a processing flow of a DA conversion apparatus 10 according to the present embodiment. Prior to outputting a current, the DA conversion apparatus 10 performs calibration (S11). The DA conversion apparatus 10 may perform the calibration immediately after activating or resetting power supply, or may perform regular calibration.

After completion of calibration, the DA conversion apparatus 10 outputs the current (S12). In outputting the current, the DA conversion apparatus 10 supplies a current corresponding to the input data received from outside, to the output end(s) 20.

Figure 4:
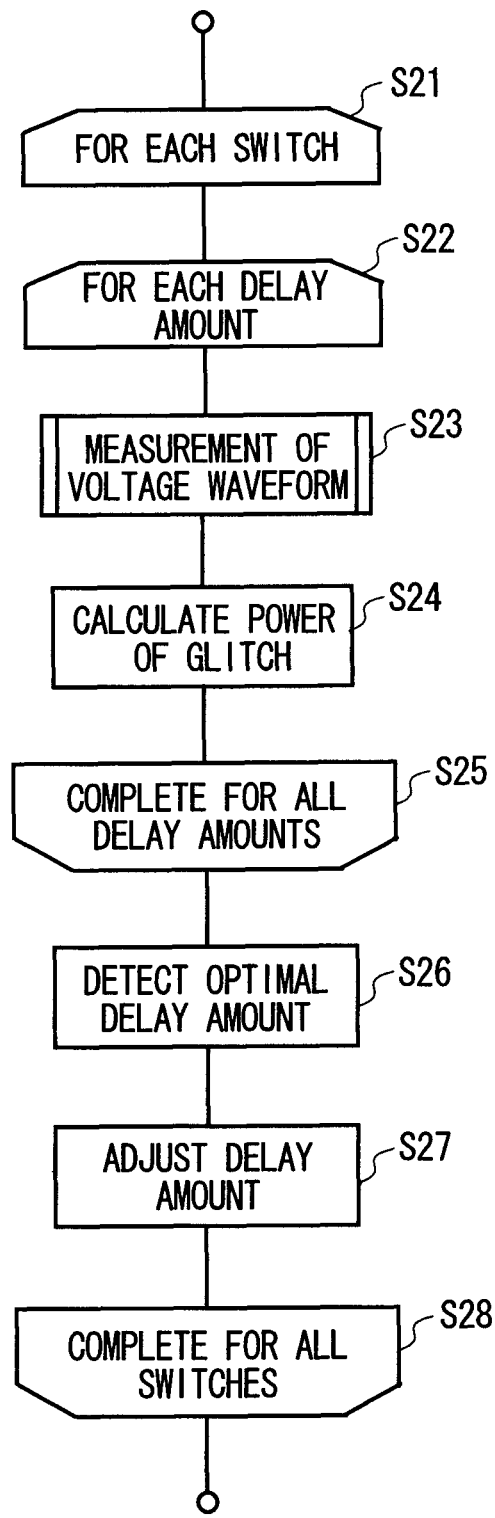
FIG. 4 shows a processing flow of an adjusting section 34 in Step S11 of FIG. 3.

FIG. 4 shows a detailed processing flow of Step S11 of FIG. 3. In calibration, the adjusting section 34 sequentially selects the plurality of switches 26 to execute the processing from Step S22 to Step S27 for each selected switch 26 (loop processing between S21 and S28).

First, the adjusting section 34 changes the delay amount of the control signal supplied to the selected switch 26 by a predetermined amount, to execute the processing of Step S23 and Step S24 for each delay amount. In Step S23, the adjusting section 34 controls the measurement section 32 to measure the voltage waveform corresponding to the current supplied to the output end(s) 20 when the current of the pre-designated waveform is supplied to the output end(s) 20.

For example, the adjusting section 34 controls the measurement section 32 to measure the voltage waveform corresponding to the current supplied to the output end(s) 20 when the selected switch 26 is switched from the first state to the second state, and the other unselected switches 26 are switched from the second state to the first state. To be more specific, the adjusting section 34 may control the measurement section 32 to measure the voltage waveform corresponding to the current supplied to the output end(s) 20, when input data is provided such as to change the bit corresponding to the selected switch 26 from 1 to 0 (or 0 to 1), and to change the bit corresponding to the other switches 26 from 0 to 1 (or 1 to 0).

Next, in Step S24, the adjusting section 34 calculates the glitch power contained in the measured voltage waveform. For example, the adjusting section 34 calculates the area of either a waveform component higher than a predicted voltage or a voltage component lower than the predicted voltage, from among the measured voltage waveform.

Then, after completing the processing of Step S23 and Step S24 for all the delay amounts (S25), the processing proceeds to Step S26. In Step S26, the adjusting section 34 detects a delay amount at which the calculated glitch power becomes the minimum or smaller than the reference value. Accordingly, the adjusting section 34 can detect a delay amount optimal for reducing the glitch noise arising when switching the selected switch 26.

Next, in Step S27, the adjusting section 34 adjusts the delay section 30 to cause the delay amount of the control signal for controlling the selected switch 26 to the value detected in Step S26. For example, the adjusting section 34 adjusts the delay amount of the variable delay circuit 38 that delays the control signal supplied to the selected switch 26.

The adjusting section 34 performs the above-stated processing to all the plurality of switches 26 to the last (S28). Accordingly, the adjusting section 34 can adjust the delay amount of each of the plurality of control signals to reduce the glitch noise contained in the voltage waveform corresponding to the current supplied to the output end(s) 20.

Note that the adjusting section 34 may perform the processing from Step S21 to Step S28 a plurality of times. By doing so, the adjusting section 34 can further reduce the variation in skew of the plurality of control signals, to reduce the glitch noise contained in the voltage waveform corresponding to the current supplied to the output end(s) 20.

In addition, the adjusting section 34 may sequentially select the switches 26 from among the switches 26 corresponding to significant bits, in Step S21. By doing so, the adjusting section 34 can sequentially adjust the delay amount, starting from the control signal having a larger impact to the glitch noise.

Figure 5:
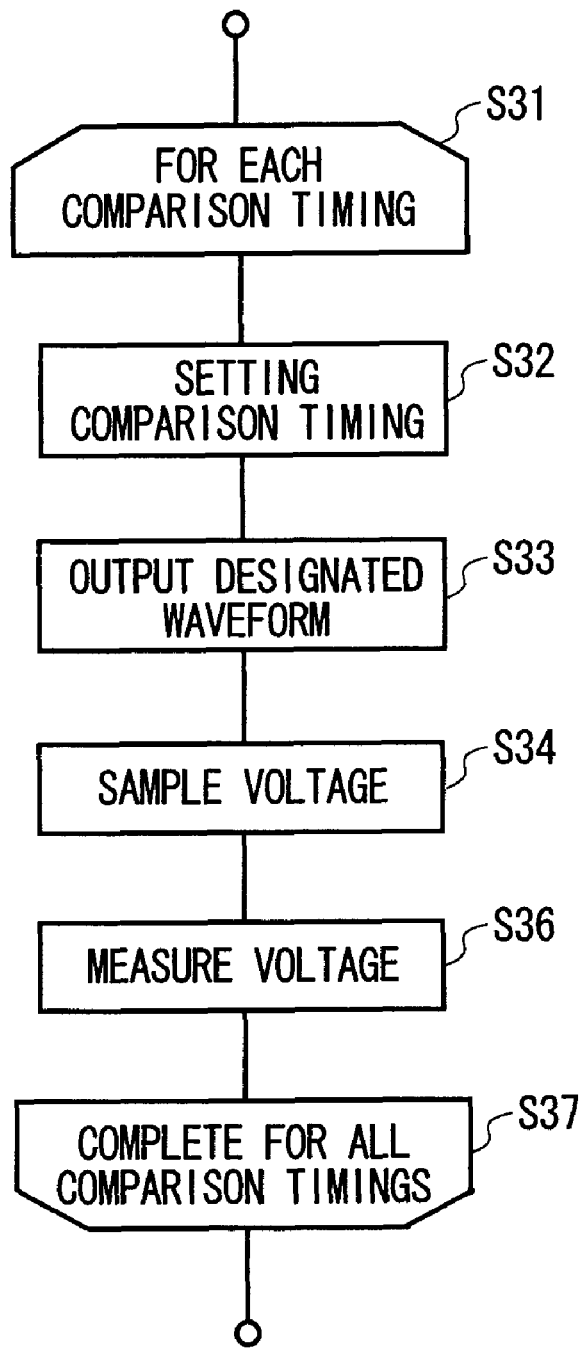
FIG. 5 shows a processing flow of a measurement section 32 in Step S23 of FIG. 4.

FIG. 5 shows a processing flow of a measurement section 32 in Step S23 of FIG. 4. The measurement section 32 repeats the processing from Step S32 to Step S36, for each of a plurality of comparison timings different from each other, with the reference timing as a reference (loop processing between S31 and S37).

First, the control section 52 of the measurement section 32 sets, to the timing adjusting section 40, a delay time corresponding to the selected comparison timing (S32). By doing so, the control section 52 can delay the timing signal representing the reference timing, to generate a timing signal representing a comparison timing delayed from the reference timing by a set period of time.

Next, at an output timing with the reference timing as a reference, the control section 52 controls the signal generator 28 to output a plurality of control signals for supplying the current of the designated waveform to the output end(s) 20 (S33). Next, the control section 52 controls the sample hold section 42 to sample the voltage at the output end(s) 20, at the timing of the timing signal representing the selected comparison timing (S34).

Next, the control section 52 measures the voltage sampled at the selected comparison timing, by the successive comparison using the measurement DAC 46 and the comparator 48 (S36). Specifically, the control section 52 sequentially changes the comparison data to be supplied to the measurement DAC 46, to change the comparison voltage generated from the measurement DAC 46. The control section 52 identifies the comparison data for causing the voltage at the output end(s) 20 to match the comparison voltage outputted from the measurement DAC 46, based on the comparison result between the voltage generated from the measurement DAC 46 that sequentially changes by the comparator 48 and the voltage at the output voltage 20. Accordingly, the control section 52 can measure the voltage at the output end(s) 20.

In successive comparison, the control section 52 changes the comparison data supplied to the measurement DAC 46, according to binary search based on the comparison result of the comparator 48. Accordingly, the control section 52 can quickly identify the comparison data that causes the voltage at the output end(s) 20 to substantially match the voltage outputted from the measurement DAC 46.

The measurement section 32 repeats the above processing for each of the plurality of comparison timings different from each other. Accordingly, the measurement section 32 can control, to be outputted from the signal generator 28, the plurality of control signals for supplying the current of the designated waveform to the output end(s) 20, a plurality of times at an output timing with the reference timing as a reference. Then, the measurement section 32 can measure the voltage at the output end(s) 20 to which the current of the designated waveform is supplied, at each of the plurality of comparison timings different from each other with the reference timing as a reference.

Figure 6:
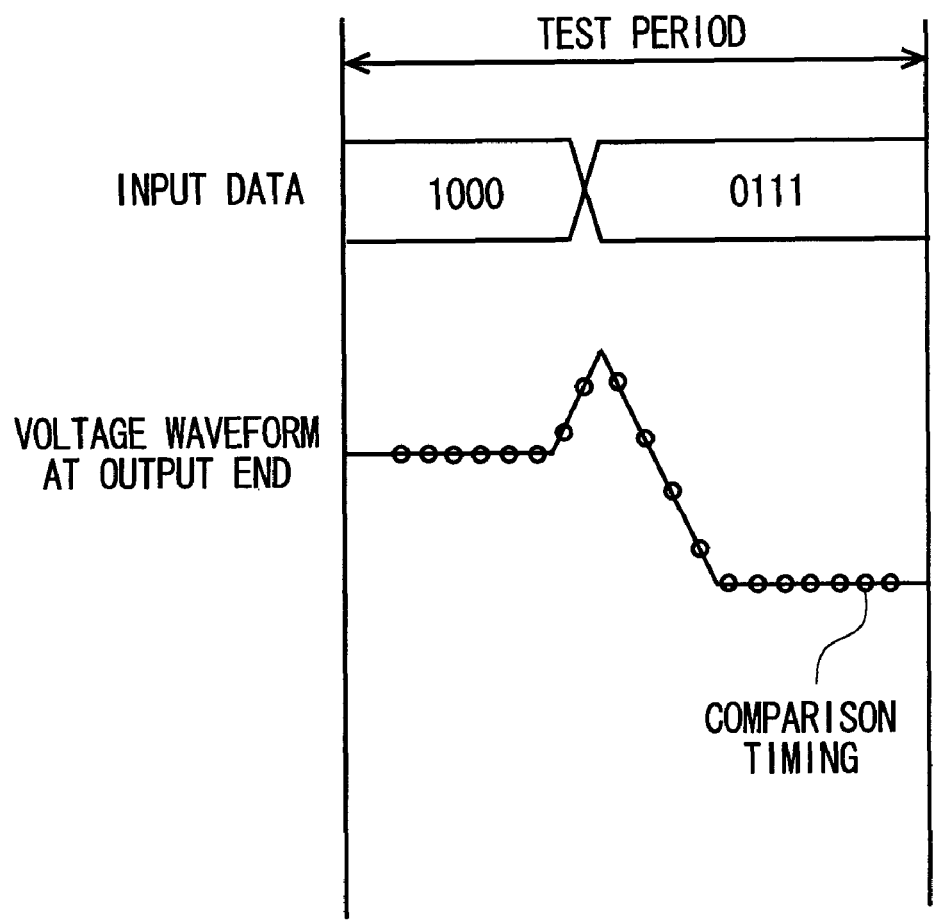
FIG. 6 shows an example of input data inputted to a DA conversion apparatus 10 as well as a voltage waveform at an output end(s) 20, according to the present embodiment.

FIG. 6 shows an example of input data inputted to the DA conversion apparatus 10 as well as the voltage waveform at the output end(s) 20, according to the present embodiment. For example, the measurement section 32 causes a plurality of control signals for supplying the current of the designated waveform to the output end(s) 20, for each period (hereinafter referred to "test period") at which the timing signal is generated by the timing generator 36.

In measuring a waveform, the measurement section 32 supplies, to the signal generator 28, the input data for switching the current supplied to the output end(s) 20 from the first amount of current to the second amount of current, at a fixed timing within the test period. For example, the measurement section 32 supplies, to the signal generator 28, input data for switching the selected switch 26 from the first state to the second state, and the other unselected switches 26 from the second state to the first state.

In the example of FIG. 6, the measurement section 32 has selected the switch 26 corresponding to the most significant bit. Then, the measurement section 32 supplies, to the signal generator 28, input data for switching the bit (most significant bit) corresponding to the selected switch 26 from 1 to 0, and the bits (from the first bit to the third bit) corresponding to the unselected switches 26 from 0 to 1, at one timing within the test period.

In the example of FIG. 6, when the switch timing of the selected switch 26 is delayed from the switch timing of the unselected switches 26, the plurality of switches 26 will undergo the state transition "1000"→"1111"→"0111," via the intermediate state (1111). On the other hand, when the switch timing of the selected switch 26 is ahead of the switch timing of the unselected switches 26, the plurality of switches 26 will undergo the state transition "1000"→"0000"→"0111," via the intermediate state (0000). When the switch timing of the selected switch 26 matches the switch timing of the unselected switches 26, the plurality of switches 26 will undergo the state transition "1000"→"0111," which does not bypass any intermediate state.

Thus, the adjusting section 34 can change the delay amount of the control signal supplied to the selected switch 26 and measure the glitch power from the voltage waveform measured by the measurement section 32 for each change amount, to detect the delay amount with which the switch timing of the selected switch 26 can be approximated to the switch timing of the unselected switches 26. Therefore, the adjusting section 34 can detect the delay amount optimal for the control signal supplied to the selected switch 26.

In waveform measurement, the measurement section 32 repetitively outputs the current of the designated waveform for each test period. Then the measurement section 32 measures the voltage at the output end(s) 20, by shifting the comparison timing for each test period. For example, the measurement section 32 measures the voltage by shifting the comparison timing at a time interval that is sufficiently minute as to detect the gradient of the designated waveform. Accordingly, the measurement section 32 can measure the voltage waveform at the output end(s) 20 when the current of the designated waveform is supplied to the output end(s) 20.

Figure 7:
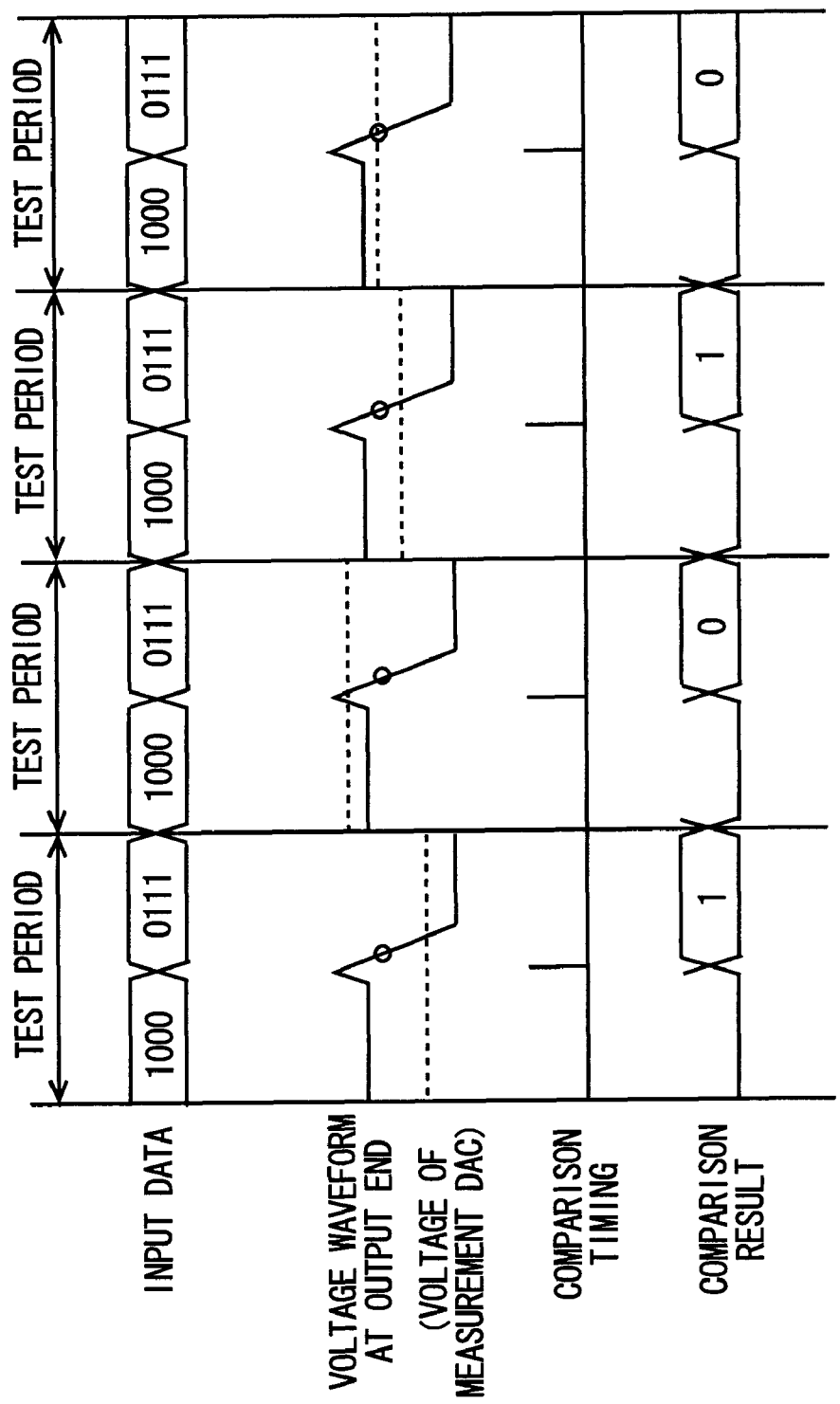
FIG. 7 shows an example of input data inputted to a DA conversion apparatus 10, a voltage waveform at an output end(s) 20, and a voltage for a measurement DAC, and a comparison result, in a case where the voltage for the measurement DAC was changed for each test period.

FIG. 7 shows an example of input data inputted to the DA conversion apparatus 10, the voltage waveform at the output end(s) 20, and the voltage for the measurement DAC, and the comparison result, in a case where the voltage for the measurement DAC was changed for each test period. The measurement section 32 may not include a sample hold section 42. If so, the differential/single conversion section 44 may be directly connected to the differential voltage between the first output end 12 and the second output end 14.

In this case, the timing signal representing the comparison timing outputted from the timing adjusting section 40 is supplied to the comparator 48, instead of being supplied to the sample hold section 42. At the timing represented by the timing signal, the comparator 48 compares the magnitude of the comparison voltage generated by the measurement DAC 46 and the magnitude of the voltage at the output end(s) 20.

In this case, in the sate where one comparison timing is set to the timing adjusting section 40, the control section 52 of the measurement section 32 outputs a plurality of times, from the signal generator 28, a plurality of control signals for supplying the current of the designated waveform to the output end(s) 20. Then, every time the plurality of control signals are outputted, the control section 52 controls the comparator 48 to compare the voltage at the output end(s) 20 with the comparison voltage changed for each comparison processing at one comparison timing, to measure the voltage at the output end(s) 20 at one comparison timing.

For example, as shown in FIG. 7, the control section 52 changes the comparison voltage according to binary search for each test period. Accordingly, the control section 52 can identify the comparison data that causes the voltage at the output end(s) 20 to substantially match the comparison voltage outputted from the measurement DAC 46.

Figure 8:
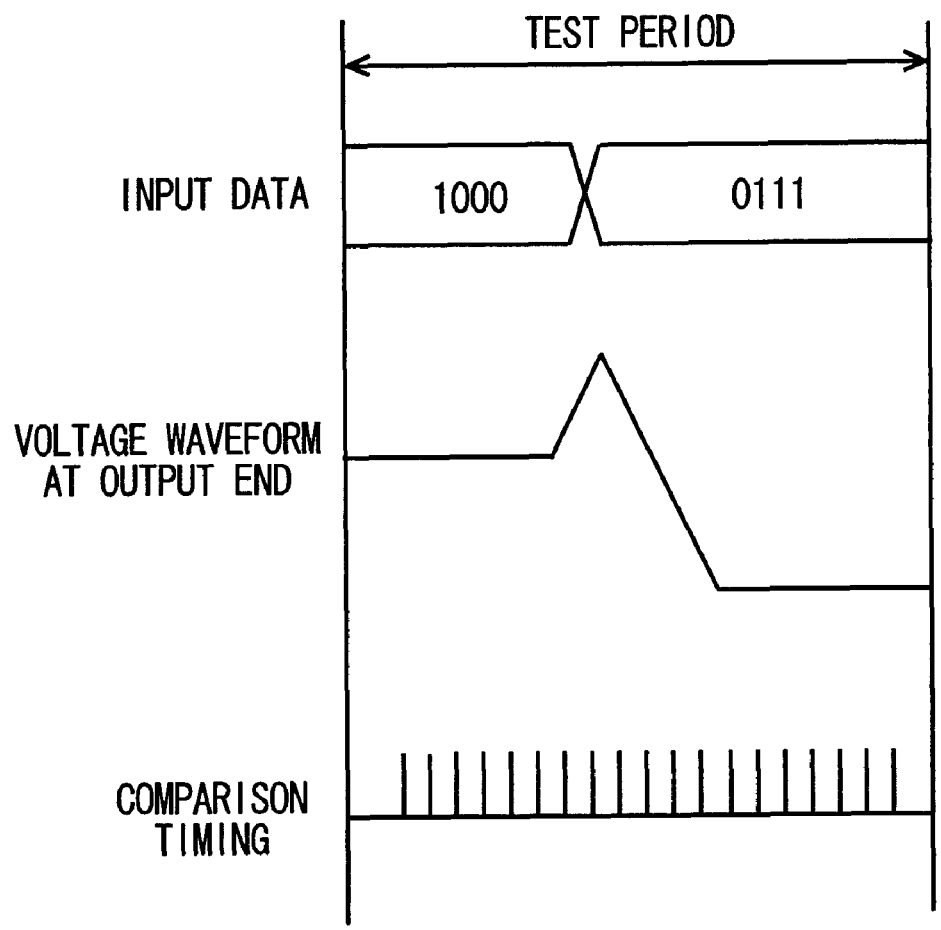
FIG. 8 shows an example of input data inputted to a DA conversion apparatus 10, a voltage waveform at an output end(s) 20, and a plurality of strobe signals, in a case where the comparison voltage is compared to the voltage at the output end(s) 20 at a plurality of comparison timings designated by the plurality of strobe signals.

FIG. 8 shows an example of input data inputted to the DA conversion apparatus 10, the voltage waveform at the output end(s) 20, and the plurality of strobe signals, in a case where the comparison voltage is compared to the voltage at the output end(s) 20 at a plurality of comparison timings designated by the plurality of strobe signals. The measurement section 32 may measure the voltage waveform at the output end(s) 20, using the plurality of strobe signals consecutive with a predetermined time interval therebetween as shown in FIG. 8.

In this case, the DA conversion apparatus 10 includes a multistrobe circuit for example. The multistrobe circuit includes a plurality of minute delay elements connected in series, for example. The multistrobe circuit causes a timing signal to pass through the plurality of minute delay elements, so that a plurality of signals are outputted from the plurality of minute delay elements as a plurality of strobe signals.

In addition, the sample hold section 42 includes a plurality of sample hold circuits associated with the plurality of strobe signals respectively, for example. Each of the plurality of sample hold circuits samples the voltage at the output end(s) 20 at the timing of the corresponding strobe signal.

Then, the control section 52 sequentially measures the voltage held by each of the plurality of sample hold circuits, by means of successive comparison using the measurement DAC 46 and the comparator 48. Accordingly, the measurement section 32 can quickly measure the voltage waveform at the output end(s) 20.

Figure 9:
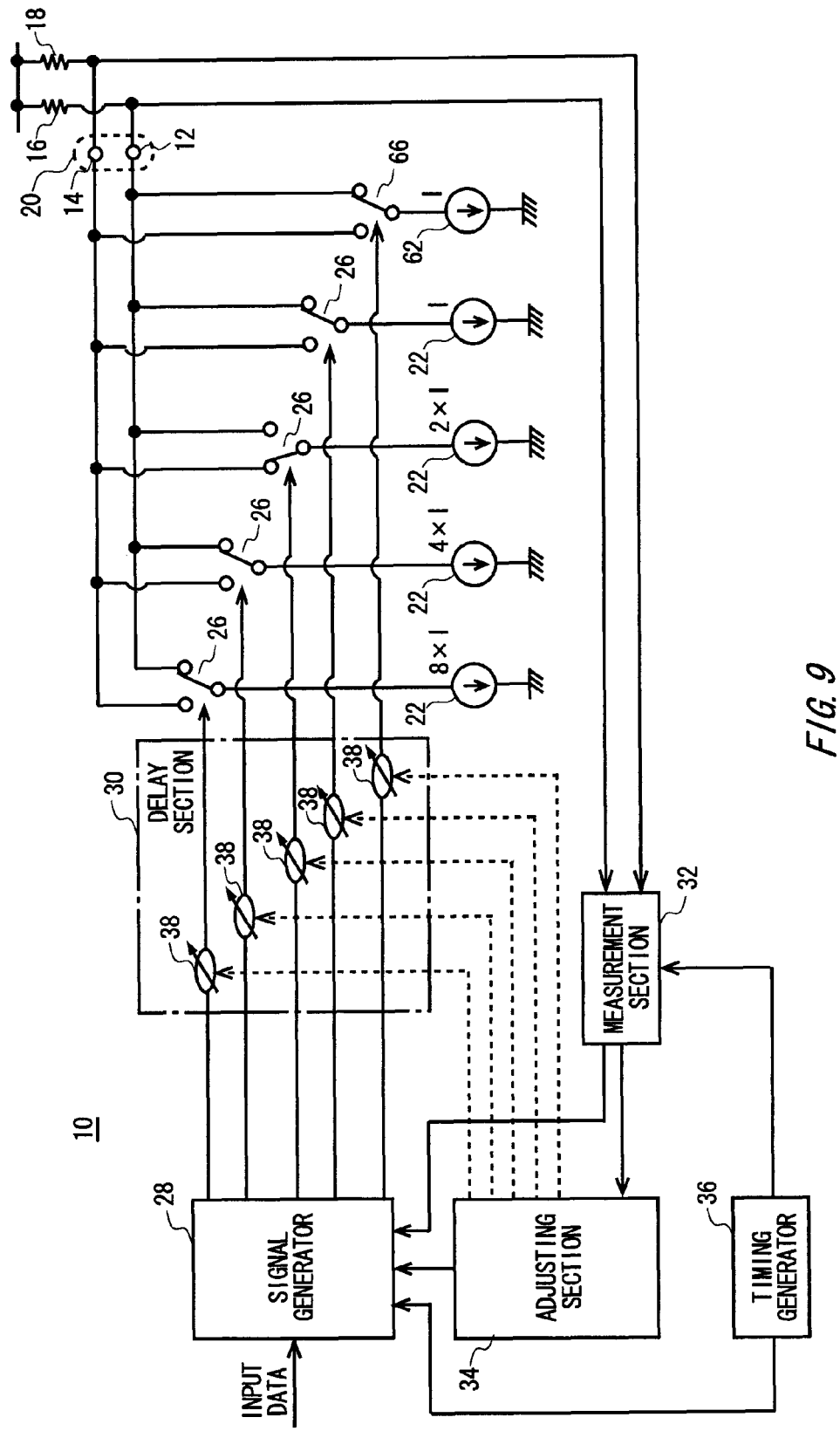
FIG. 9 shows a configuration of a DA conversion apparatus 10 according to a first modification example of the present embodiment.

FIG. 9 shows a configuration of a DA conversion apparatus 10 according to a first modification example of the present embodiment. The DA conversion apparatus 10 according to the present modification example has substantially the same configuration and function as that of the DA conversion apparatus 10 shown in FIG. 1, and so the members having substantially the same configuration and function as those of the DA conversion apparatus 10 in FIG. 1 are assigned the same reference numerals, and are not explained in the following except for the differences therebetween.

The DA conversion apparatus 10 according to the present modification example further includes a dummy current source 62 and a dummy switch 66. The dummy switch 66 switches whether to supply the current of the dummy current source 62 to the output end(s) 20, according to the control signal received from the signal generator 28.

In the present example, the dummy switch 66 switches, whether to supply the current of the dummy current source 62 to the first output end 12 or to the second output end 14. For example, when the value of the received control signal is 1, the dummy switch 66 supplies the current of the dummy current source 62 to the first output end 12, whereas when the value of the control signal is 0, the dummy switch 66 supplies the current of the dummy current source 62 to the second output end 14.

In addition, the plurality of current sources 22 according to the present modification example sequentially generate currents that sequentially differ in magnitude by a power of 2 starting from a less significant bit. For example, the current source 22 corresponding to the least significant bit supplies a current in the amount of $2^0 \times I$, the current source 22 corresponding to the second bit supplies a current in the amount of $2^1 \times I$, and the current source 22 corresponding to the Nth bit (where N is an integer equal to or greater than 2) supplies a current in the amount of $2^{(N-1)} \times I$.

The dummy current source 62 supplies the same current as the current supplied from the current source 22 supplying the minimum current among the plurality of current sources 22. The dummy current source 62 supplies the current in the amount of $2^0 \times I$.

Figure 10:
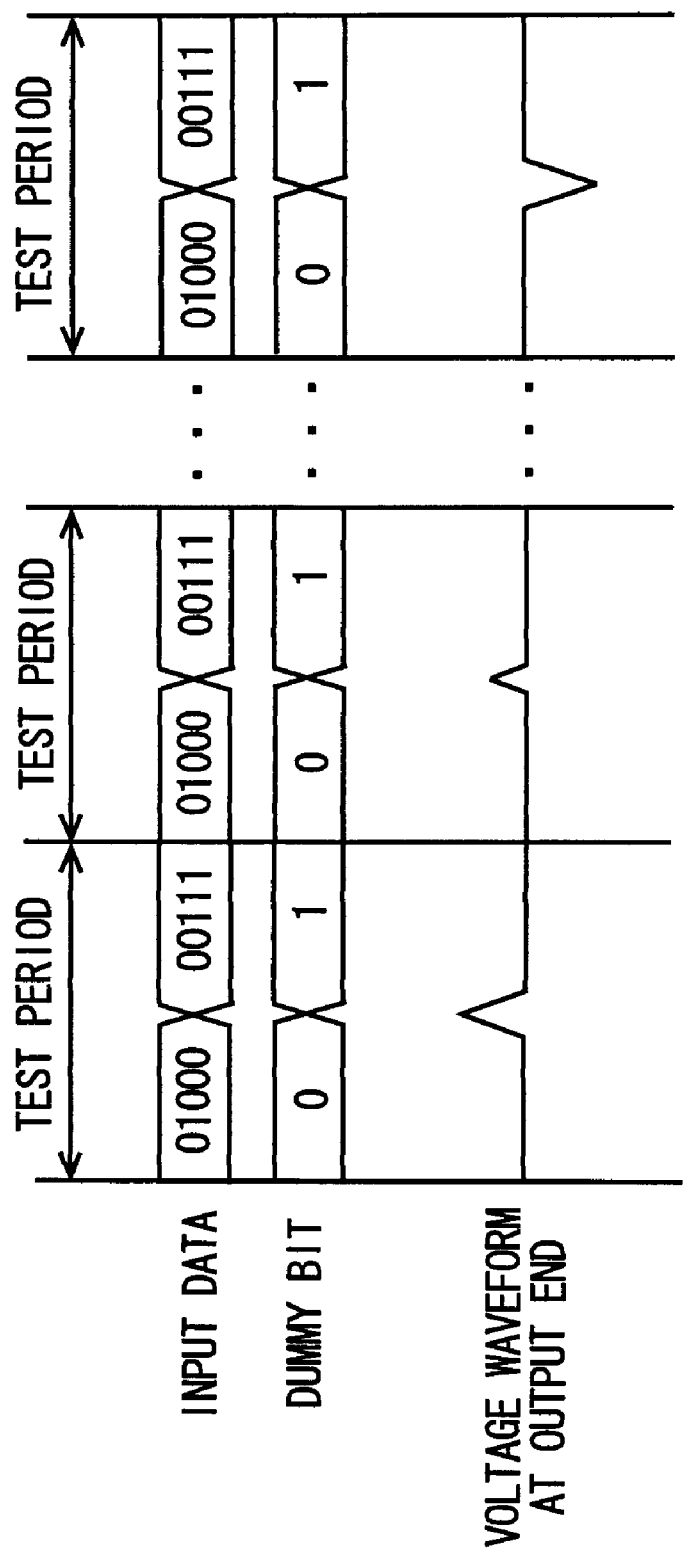
FIG. 10 shows an example of input data, a dummy bit, and a voltage waveform at an output end(s) 20, in a case where the delay amount of a control signal supplied to a selected switch 26 is changed for each test period in a DA conversion apparatus 10 according to the first modification example.

FIG. 10 shows an example of input data, a dummy bit, and a voltage waveform at an output end(s) 20, in a case where the delay amount of a control signal supplied to a selected switch 26 is changed for each test period in a DA conversion apparatus 10 according to the first modification example.

In the DA conversion apparatus 10 according to the first modification example having the stated configuration, the measurement section 32 supplies the current having the following waveform for each test period to the output end(s) 20, in measuring the waveform.

Specifically, the measurement section 32 supplies, to the signal generator 28, input data for switching the selected switch 26 from the first state to the second state, switching the switches 26 corresponding to the bits lower than the selected switch 26 from the second state to the first state, switching the dummy switch 66 from the second state to the first state, and not switching the switches 26 corresponding to the bits higher than the selected switch 26.

For example, suppose where the input data is 5 bits, and the switch 26 corresponding to the fourth bit has been selected. In this case, as shown in FIG. 10, for example, the measurement section 32 supplies, to the switch 26, the input data that switches at the output timing designated from "01000" to "00111."

If such input data is provided, when the switching timing is the same between the plurality of switches 26, the output end(s) 20 will undergo the same voltage between before and after the switch. In other words, the output end(s) 20 will always undergo a constant voltage. However, when the switch timing of the selected switch 26 is delayed from the switch timing of the unselected switches 26, the plurality of switches 26 will undergo the state transition "01000"→"01111"→"00111," via the intermediate state (01111). On the other hand, when the switch timing of the selected switch 26 is ahead of the switch timing of the unselected switch 26, the plurality of switches 26 will undergo the state transition "01000"→"00000"→"00111," via the intermediate state (00000).

By detecting the level of the detected voltage waveform, the measurement section 32 can detect the glitch power. Accordingly, the measurement section 32 can detect the glitch power by a simple operation.

Note that the effect of shift of the switch timing of the dummy switch 66 becomes smaller in the higher bits. Therefore, the adjusting section 34 may detect the glitch power from the bits higher than a predetermined bit, in the method explained above. Accordingly, the adjusting section 34 can adjust the delay amount of the control signal with accuracy regardless of the shift in switch timing of the dummy switch 66.

Figure 11:
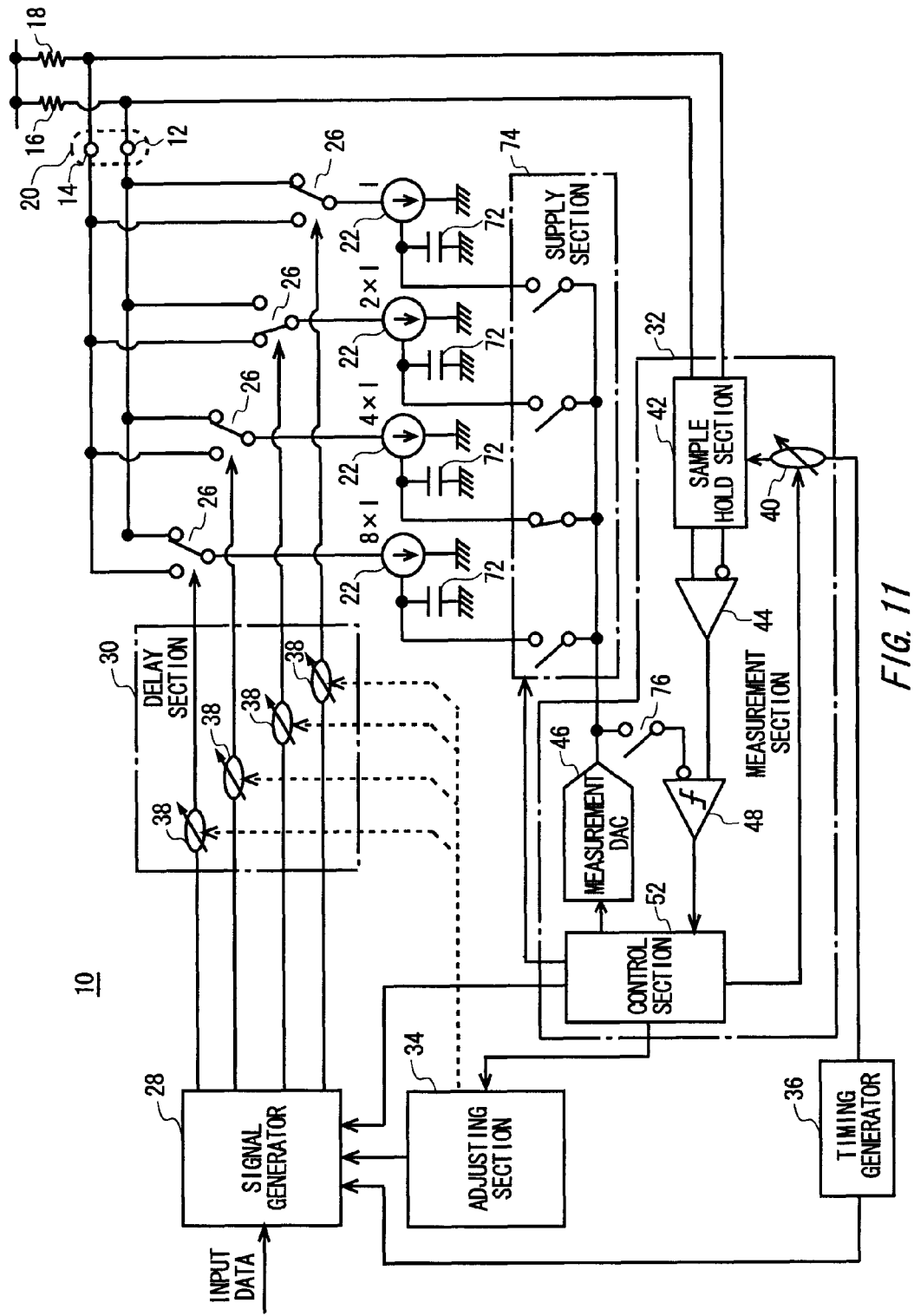
FIG. 11 shows a configuration of a DA conversion apparatus 10 according to a second modification example of the present embodiment.

FIG. 11 shows a configuration of a DA conversion apparatus 10 according to a second modification example of the present embodiment. The DA conversion apparatus 10 according to the present modification example has substantially the same configuration and function as that of the DA conversion apparatus 10 shown in FIG. 1, and so the members having substantially the same configuration and function as those of the DA conversion apparatus 10 in FIG. 1 are assigned the same reference numerals, and are not explained in the following except for the differences therebetween.

The DA conversion apparatus 10 according to the present modification example further includes a plurality of capacitors 72 and a supply section 74. In the present modification example, each of the plurality of current sources 22 is a constant current source supplying a current corresponding to the designated voltage applied to the current setting end. The plurality of current sources 22 may be the same circuit as each other The plurality of capacitors 72 are associated with the plurality of current sources 22 respectively. Each of the plurality of capacitors 72 is provided between the current setting end of a corresponding current source 22 and the reference potential, and holds the designating voltage designating the current of the corresponding current source 22. Each of the plurality of capacitors 72 is charged with an adequate designated voltage by the measurement DAC 46. Each of the plurality of capacitors 72 applies the held designating voltage to the current setting end of the corresponding current source 22.

The measurement section 32 according to the present modification example further includes a DAC switch 76. The DAC switch 76 is provided between the voltage generating end of the measurement DAC 46 and the comparator 48. In calibration, the DAC switch 76 connects between the comparator 48 and the voltage generating end of the measurement DAC 46, and disconnects the comparator 48 from the measurement DAC 46 in outputting a current.

The measurement DAC 46 of the measurement section 32 according to the present modification example sequentially and adequately generates the designating voltage to be held by each of the plurality of capacitors 72, prior to outputting the current or during the current output by the DA conversion apparatus 10. The measurement DAC 46 according to the present modification example is of a charge redistribution type.

The supply section 74 supplies the designating voltage sequentially generated by the measurement DAC 46, by sequentially switching to a corresponding capacitor 72 of the plurality of capacitors 72. For example, the supply section 74 includes a plurality of transfer switches 78.

The plurality of transfer switches 78 are associated with the plurality of current sources 22 respectively. Each of the plurality of transfer switches 78 is provided between the voltage generating end of the measurement DAC 46 and a corresponding current source 22. When supplying a designating voltage to any one of the capacitors 72, the plurality of transfer switches 78 connects between the voltage generating end of the measurement DAC 46 having generated the designating voltage to be designated to the corresponding current source 22, and the current setting end of the corresponding current source 22, and disconnects the voltage generating end of the measurement DAC 46 from the current setting end of the other current sources 22.

Here, each of the plurality of transfer switches 78 repeats connection and disconnection between the voltage generating end of the measurement DAC 46 and the current setting end of the corresponding current source 22, to gradually charge each capacitor 72 with the designating voltage generated by the measurement DAC 46, to sequentially cause the voltage of the capacitor 72 to be approximated to the designating voltage. Accordingly, each of the plurality of transfer switches 78 can supply the designating voltage generated by the measurement DAC 46 to the capacitor 72.

The explained DA conversion apparatus 10 can designate the amount of current of each of the plurality of current sources 22, by means of the measurement DAC 46. Accordingly, the DA conversion apparatus 10 can accurately set the amount of current supplied from the plurality of current sources 22, which helps output an accurate current.

Figure 12:
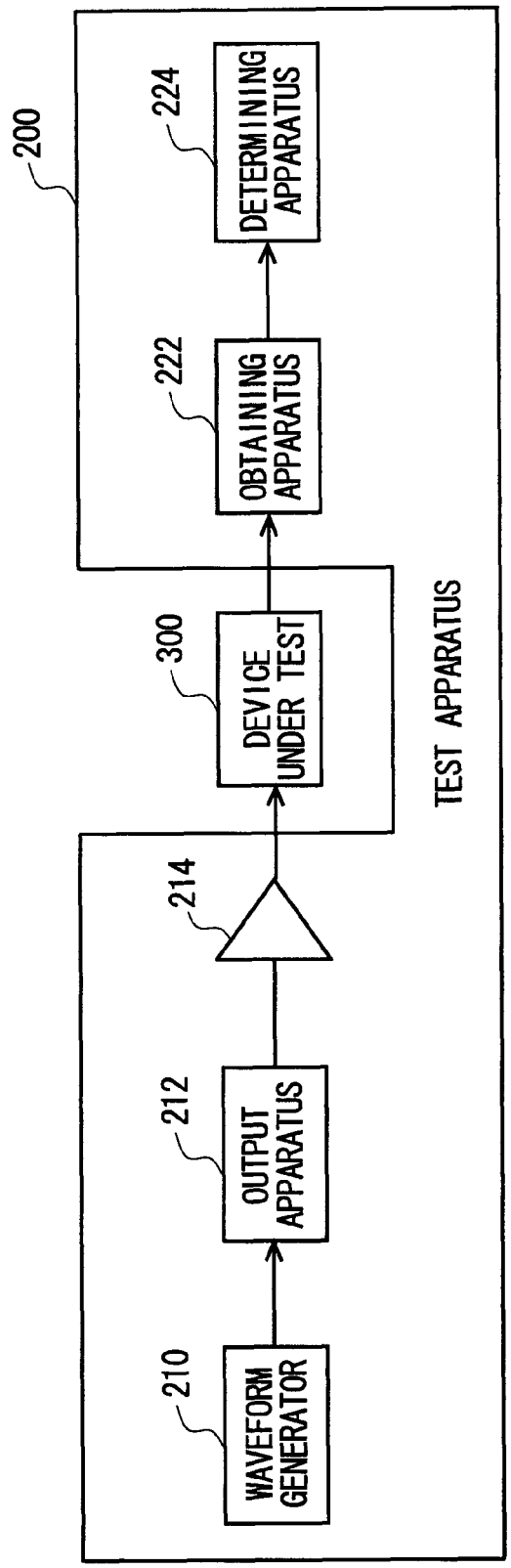
FIG. 12 shows a configuration of a test apparatus 200 according to the present embodiment, together with a device under test 300.

FIG. 12 shows a configuration of a test apparatus 200 according to the present embodiment, together with a device under test 300. The test apparatus 200 tests a device under test 300 such as a semiconductor apparatus.

The test apparatus 200 includes a waveform generator 210, an output apparatus 212, a drive apparatus 214, an obtaining apparatus 222, and a determining apparatus 224. The waveform generator 210 generates waveform data representing a test signal to be supplied to the device under test 300.

The output apparatus 212 outputs a current corresponding to the waveform data generated by the waveform generator 210. The output apparatus 212 has the same configuration as that of the DA conversion apparatus 10 explained above with reference to FIG. 1 through FIG. 11. Note that the delay section 30 of the DA conversion apparatus 10 is realized by a delay circuit included in the test apparatus 200. In addition, the comparator 48 included in the DA conversion apparatus 10 is realized by a level comparator included in the test apparatus 200.

The drive apparatus 214 outputs a test signal having a voltage corresponding to the current outputted from the output apparatus 212. The drive apparatus 214 supplies the outputted test signal to the device under test 300.

The obtaining apparatus 222 obtains a response signal outputted in response to the test signal. The obtaining apparatus 222 may measure the waveform of the response signal, or takes in the logical value of the response signal. The determining apparatus 224 determines the acceptability of the device under test 300 based on the response signal obtained by the obtaining apparatus 222.

The test apparatus 200 described above can output an accurate current with fast response from the output apparatus 212, to test the device under test 300 with accuracy using a high-speed test signal. In addition, the test apparatus 200 can have an output apparatus 212 having a small configuration, and the entire test apparatus can be generated at low cost.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. An output apparatus for outputting a current from an output end, comprising:
   a plurality of current sources;
   a plurality of switches provided in association with the plurality of current sources respectively, and switching whether to supply a current of a corresponding current source to the output end;
   a time changing section that changes a propagation time of each of a plurality of control signals for controlling switching states of the plurality of switches respectively; and
   an adjusting section that adjusts the propagation time of each of the plurality of control signals to reduce glitch noise contained in a current supplied to the output end.

2. The output apparatus according to claim 1, wherein
   the time changing section includes a delay section that delays each of the plurality of control signals, and
   the adjusting section adjusts a delay amount of each of the plurality of control signals.

3. The output apparatus according to claim 2, being a DA conversion apparatus that supplies, to the output end, a current corresponding to input data received from outside, and further comprising:
   a signal generator supplying the plurality of control signals corresponding to the input data to the plurality of switches via the delay section.

4. The output apparatus according to claim 3, further comprising:
   a measurement section that measures a voltage waveform corresponding to a current supplied to the output end, when switching the current supplied to the output end, wherein
   the adjusting section adjusts the delay amount of each of the plurality of control signals to reduce glitch noise contained in the voltage waveform, based on a measurement result of the measurement section.

5. The output apparatus according to claim 4, wherein
   the adjusting section changes a delay amount of a control signal supplied to a selected one of the plurality of switches, and controls the measurement section to measure, for each delay amount, a voltage waveform corresponding to a current supplied to the output end, when switching the selected switch from a first state to a second state and switching unselected switches from a second state to a first state, and
   adjusts the delay amount of the control signal supplied to the selected switch to reduce glitch noise, based on the voltage waveform for each delay amount.

6. The output apparatus according to claim 4, further comprising:
   a resistance connected between the output end and a reference potential.

7. The output apparatus according to claim 5, wherein
   the measurement section includes:
   a measurement DAC generating a comparison voltage;
   a comparator comparing a magnitude of the comparison voltage to a magnitude of a voltage at the output end at a comparison timing; and
   a control section measuring a voltage waveform at the output end when supplying a current of a designated waveform, based on a comparison result of the comparator obtained as a result of controlling the comparison voltage and the comparison timing.

8. The output apparatus according to claim 7, wherein
   the measurement section further includes a sample hold section that samples the voltage at the output end at the comparison timing, and
   the comparator compares a magnitude of the comparison voltage and a magnitude of a voltage held by the sample hold section.

9. The output apparatus according to claim 7, wherein
   the measurement section controls the signal generator to output a plurality of control signals for supplying to the output end the current of the designated waveform a plurality of times, at one output timing with a reference timing as a reference, and
   measures the voltage at the output end to which the current having the designated waveform is supplied, at each of a plurality of comparison timings different from each other with the reference timing as a reference.

10. The output apparatus according to claim 9, wherein
    the measurement section controls the signal generator to output the plurality of control signals a plurality of times at the one output timing, and
    every time the plurality of control signals are outputted, compares the voltage at the output end with a comparison voltage changed for each comparison processing at one comparison timing, to measure the voltage at the output end at the one comparison timing.

11. The output apparatus according to claim 9, wherein
    the measurement section measures the voltage at the output end to which the current having the designated waveform is supplied, at a plurality of comparison timings designated by a plurality of strobe signals respectively, the plurality of strobe signals being consecutive with a predetermined time interval therebetween.

12. The output apparatus according to claim 4, further comprising:
    a dummy current source; and
    a dummy switch switching whether to supply a current of the dummy current source to the output end, wherein
    the plurality of current sources generate currents that sequentially differ in magnitude by a power of 2 starting from a less significant bit,
    the dummy current source supplies a current that is the same as a current supplied from one of the plurality of current sources that supplies a minimum current,
    the adjusting section changes a delay amount of a control signal supplied to a selected one of the plurality of switches, and controls the measurement section to measure, for each delay amount, a voltage waveform corresponding to a current supplied to the output end, when switching the selected switch from a first state to a second state, switching switches corresponding to bits lower than the selected switch from a second state to a first state, and switching the dummy switch from a second state to a first state, and not switching switches corresponding to bits higher than the selected switch, and adjusts the delay amount of the control signal supplied to the selected switch to reduce glitch noise, based on the voltage waveform for each delay amount.

13. The output apparatus according to claim 7, further comprising:
at least one capacitor provided in association with at least one of the plurality of current sources, and holding a designating voltage designating a current of a corresponding current source, wherein
the measurement DAC generates the designating voltage to be designated to each of the at least one capacitor when the output apparatus outputs a current.

14. A test apparatus for testing a device under test, comprising:
a waveform generator generating waveform data representing a waveform of a signal to be applied to the device under test;
the output apparatus according to claim 3 outputting a current corresponding to the waveform data; and
a drive apparatus applying, to the device under test, a voltage corresponding to the current outputted from the output apparatus.

* * * * *